United States Patent
Huang et al.

(10) Patent No.: US 10,644,517 B2
(45) Date of Patent: May 5, 2020

(54) BATTERY BALANCE CIRCUIT, CONTROL METHOD FOR BATTERY BALANCE AND BATTERY SYSTEM

(71) Applicant: Joulwatt Technology (Zhabgjiagang) Co., Ltd., Zhangjiagang (CN)

(72) Inventors: Libin Huang, Zhangjiagang (CN); Pitleong Wong, Zhangjiagang (CN); Yuancheng Ren, Zhangjiagang (CN); Xunwei Zhou, Zhangjiagang (CN)

(73) Assignee: JOULWATT TECHNOLOGY (Zhangjiagang) CO., LTD., Zhangjiagang (CN)

( * ) Notice: Subject to any disclaimer, the term of this patent is extended or adjusted under 35 U.S.C. 154(b) by 396 days.

(21) Appl. No.: 15/719,255

(22) Filed: Sep. 28, 2017

(65) Prior Publication Data
US 2018/0090950 A1    Mar. 29, 2018

(30) Foreign Application Priority Data
Sep. 29, 2016   (CN) ................ 2016 2 1089243 U

(51) Int. Cl.
| | |
|---|---|
| *H01M 10/44* | (2006.01) |
| *H01M 10/46* | (2006.01) |
| *H02J 7/00* | (2006.01) |
| *H01M 10/48* | (2006.01) |
| *H01M 10/42* | (2006.01) |
| *G01R 31/392* | (2019.01) |
| *H03K 5/24* | (2006.01) |
| *G01R 19/165* | (2006.01) |
| *H03K 19/20* | (2006.01) |

(52) U.S. Cl.
CPC .......... *H02J 7/0026* (2013.01); *G01R 31/392* (2019.01); *H01M 10/425* (2013.01); *H01M 10/441* (2013.01); *H01M 10/48* (2013.01); *H01M 10/486* (2013.01); *H02J 7/0014* (2013.01); *H03K 5/24* (2013.01); *G01R 19/16542* (2013.01); *H01M 2010/4271* (2013.01); *H03K 19/20* (2013.01)

(58) Field of Classification Search
CPC ....... H02J 7/0014; H02J 7/0016; H02J 7/0018
USPC .................. 320/107, 116, 118, 119, 120
See application file for complete search history.

(56) References Cited

U.S. PATENT DOCUMENTS

| | | | |
|---|---|---|---|
| 2014/0285156 A1* | 9/2014 | Mukaitani | H02J 7/007 320/134 |
| 2015/0108950 A1* | 4/2015 | Yun | H02J 7/0068 320/134 |
| 2017/0054134 A1* | 2/2017 | Choi | H02J 7/0013 |

* cited by examiner

*Primary Examiner* — Edward Tso

(57) ABSTRACT

Disclosed a battery balance circuit, a control method for battery balance and a battery system. The battery balance circuit is implemented on basis of a circuit structure having a plurality of cascaded balance modules, in which a judgement of abnormal states of batteries or balance modules is realized together with synchronizations of the detection of battery states and battery balance. When the judgement of abnormal states of batteries (including the abnormal states of battery voltages, battery temperatures and battery currents) is made, the balance modules stop balancing by transferring signals, meanwhile, when the balance modules restore from the abnormal state, they restore balance. The disclosure increases the judgement of abnormal states, and implements detection and alarm at abnormal states.

16 Claims, 5 Drawing Sheets

- Prior Art -

BATTERY BALANCE CIRCUIT, CONTROL METHOD FOR BATTERY BALANCE AND BATTERY SYSTEM

CROSS-REFERENCE TO RELATED APPLICATION

This application claims the benefit of Chinese Patent Application No. 201610860038.5, filed on Sep. 29, 2016, which is incorporated herein by reference in its entirety.

BACKGROUND OF THE DISCLOSURE

Field of the Disclosure

The present disclosure relates to the field of power electronics, and more particularly, to a battery balance circuit, a control method for battery balance and a battery system.

Background of the Disclosure

When batteries are connected in series, battery power of the batteries is required to be balanced in order to prolong the life of the batteries. As shown in FIG. 1, balance modules U1, U2 and U3 are used to balance battery power of series batteries 1 to 4. The balance module U1 has three input-output terminals respectively connected with the cathode of the battery 1, the anode of the battery 1 (i.e., the cathode of the battery 2) and the anode of the battery 2. The balance module U1 detects and balances the voltages of the batteries 1 and 2, to control the voltage difference between the two batteries to be within a certain value. When the voltage of the battery 2 is greater than that of the battery 1 by a certain value, the balance module U1 transfers battery power from the battery 2 to the battery 1, by using point B as an input of the balance module U1 and point A as an output of the balance module U1; when the voltage of the battery 1 is greater than that of the battery 2 by a certain value, the balance module U1 transfers battery power from the battery 1 to the battery 2, by using point A as the input of the balance module U1 and the point B as the output of the balance module U1. Similarly, the balance module U3 balances the voltages of the batteries 3 and 4, and the balance module U2 balances the voltages of the batteries 1, 2, 3 and 4.

For a higher-precision voltage detection, the balance modules stop balancing while detecting battery voltages. Thus, all the balance modules are required to be synchronized with each other, that is, the balance modules start to balance at the same time and stop balancing at the same time to detect the voltages of the corresponding batteries. The balance modules perform balancing for a while, then stop balancing and detect the voltages of the batteries and then perform balancing again. In such a way, the process is repeated. The duration time for detecting the battery voltages is much less than the duration time for balancing the batteries. All the balance modules are required to be synchronized by CPU, for example, the time to start to balance, the time to stop balancing and start to detect battery voltages are required to be synchronized.

In a conventional battery balance system having a plurality of batteries connected in series, synchronization signals are transferred by pulling down current. The balance module has an input terminal Fi for receiving the synchronization signals and an output terminal Fo for outputting the synchronization signals. When ground potential of the balance module 1 is not greater than that of the balance module 2, the output terminal Fo of the balance module 1 can pull down the voltage of the input terminal Fi of the balance module 2 and the synchronization signals are transferred to the balance module 2 from the balance module 1, that is, the synchronization signals are transferred from a pre-processing balance module to a post-processing balance module. Then the balance module 2 continues to transfer the synchronization signals to a post-processing balance module which has a ground potential not greater than that of the balance module 2. Although the above method can solve the synchronization problem of the balance modules, the detection and alarm of abnormal batteries are difficult to realize. Thus the system reliability is required to be improved.

SUMMARY OF THE DISCLOSURE

In view of this, an objective of the disclosure is to provide a battery balance module and control method for battery balance and a battery system. The battery balance module and the control method for battery balance and the battery system can solve the technical problem in the prior art that the abnormal batteries cannot be detected, and thus, the system reliability is improved.

According to a first aspect, there is provided a battery balance circuit, comprising:
a plurality of balance modules configured to balance a plurality of batteries being coupled in series; and
a control module configured to provide a control signal to a logic input terminal of a first-processing balance module of the plurality of balance modules,
wherein, among the plurality of balance modules, a logic output terminal of a pre-processing balance module is coupled to a logic input terminal of a post-processing balance module, a logic output terminal of a last-processing balance module is connected with the control module,
when one of the plurality of balance modules detects an abnormal state on itself or on a corresponding battery of the plurality of batteries, it stops balancing and provides an abnormal signal representing the abnormal state and transfers the abnormal signal to its post-processing balance modules through corresponding logic output terminals stage by stage so that all its post-processing balance modules stop balancing, and then the abnormal signal is transferred from the logic output terminal of the last-processing balance module to the control module;
when the control module receives the abnormal signal, it makes a judgement of abnormity existence and outputs the control signal representing to stop balancing which is transferred from the first-processing balance module stage by stage, so that all the pre-processing balance modules of the one of the plurality of balance modules stop balancing.

Preferably, the one of the plurality of balance modules comprises: a first control circuit, a second control circuit and a logic circuit,
the first control circuit is connected with the logic input terminal of the one of the plurality of balance modules, the second control circuit is connected with the logic output terminal of the one of the plurality of balance modules, and the logic circuit is connected between the first control circuit and the second control circuit.

Preferably, the one of the plurality of balance modules further comprises:
a battery detection module
configured to detect voltages and/or currents and/or temperatures of a first battery and a second battery
Preferably, the battery detection module determines whether the voltages and/or currents and/or temperatures of the first battery and the second battery are within a range defined by upper and lower limit values, if the voltages and/or currents and/or temperatures of the first battery and the second battery are beyond the range, the battery detection module determines that states of corresponding batteries are abnormal and then transfers its determination to the control circuit of the one of the plurality of balance modules.

Preferably, when the battery detection module detects the voltages and/or currents and/or temperatures of the first battery and the second battery recovers to be within a normal range, the one of the plurality of balance modules starts to balance and provides a normal signal representing a normal state which is transferred to the post-processing balance modules of the one of the plurality of balance modules stage by stage, so that all the post-processing balance modules of the one of the plurality of balance modules begin to balance, the last-processing balance module outputs the normal signal to the control module, the control module receives the normal signal and then provides the control signal representing a normal state to the first-processing balance module which is transferred stage by stage, so that all the pre-processing balance modules of the one of the plurality of balance modules start to balance.

Preferably, the battery balance circuit further comprises: a optocoupler, which is connected between the logic output terminal of the last-processing balance module and the control module.

Preferably, the battery detection module comprises:

a first comparator which has an input terminal for receiving a signal representing a voltage of the first battery and a reference value representing an upper limit value of the voltage of the first battery, and an output terminal being connected with a first input terminal of a NOR gate;

a second comparator which has an input terminal for receiving a signal representing a voltage of the first battery and a reference value representing a lower limit value of the voltage of the first battery, and an output terminal being connected with a second input terminal of the NOR gate;

a third comparator which has an input terminal for receiving a signal representing a voltage of the second battery and a reference value representing an upper limit value of the voltage of the second battery, and an output terminal being connected with a third input terminal of the NOR gate;

a fourth comparator which has an input terminal for receiving a signal representing a voltage of the second battery and a reference value representing a lower limit value of the voltage of the second battery, and an output terminal being connected with the input terminal of the NOR gate, and an output terminal being connected with a fourth input terminal of the NOR gate, the output terminal of the NOR gate is connected with the logic circuit.

Preferably, the control module provides the control signal representing detection of battery states, when the first-processing balance module receives the control signal representing detection of battery states, it performs detection of battery states and controls the second control circuit by the logic circuit, so that all the post-processing balance modules of the first-processing balance module perform detection of battery states stage by stage and at the same time, the logic circuit in each balance module measures time for detection of battery states, when a state of a logic input terminal of a balance module has been changed but the duration time of detection of battery states does not reach a first time threshold, the detection of battery states is ineffective and the balance module does not perform balancing; when the state of the logic input terminal of balance module has been changed and the duration time of detection of battery states reaches the first time threshold, the balance module performs balancing.

Preferably, while the plurality of balance modules perform balancing, the logic circuits measure time, when the duration time of battery balance reaches a first time threshold, the plurality of balance modules stop balancing.

Preferably, the first control circuit is a pull-up circuit, the second control circuit is a pull-down circuit, the logic input terminal of each balance module is connected with a control terminal of the pull-down circuit through the logic circuit; or, the first control circuit is a pull-down circuit, the second control circuit is a pull-up circuit, the logic input terminal of each balance module is connected with a control terminal of the pull-up circuit through the logic circuit.

Preferably, when the one of the plurality of balance modules detects that a battery voltage is abnormal, the one of the plurality of balance modules stops balancing and the detection of battery states, and maintains its logic output terminal to be in high level or low level, the one of the plurality of balance modules provides a signal in high level or low level to the logic input terminals of the post-processing balance modules, so that the logic input terminals of the post-processing balance modules are set to be high level or low level, and the signal in high level or low level is transferred stage by stage until the logic input terminal of the last-processing balance module is correspondingly set to be in high level or low level, the last-processing balance module transfers the signal of high level or low level to the control module through its logic output terminal, the control module determines that a state of a battery is abnormal in accordance with the received signal in high level or low level.

According to a second aspect, there is provided a battery balance circuit, comprising:

receiving an abnormal signal from a plurality of balance modules which is configured to balance a plurality of the batteries connected in series;

generating a control signal in according to the abnormal signal;

transferring the control signal to the plurality of balance modules; and stopping balance when the plurality of balance modules receives the control signals, wherein, among the plurality of balance modules, a logic output terminal of a pre-processing balance module is connected with a logic input terminal of a post-processing balance module, a logic output terminal of a last-processing balance module is connected with the control module, when one of the plurality of balance modules detects an abnormal state on itself or on a corresponding battery of the plurality of batteries, it stops balancing and provides an abnormal signal representing an abnormal state which is transferred to its post-processing balance modules through its logic output terminals stage by stage so that all its post-processing balance modules stop balancing, and then the abnormal signal is transferred from the logic output terminal of the last-processing balance module to a control module;

when the control module receives the abnormal signal, it determines a state of a battery is abnormal and outputs the control signal representing to stop balancing which is transferred from the first-processing balance module stage by stage, so that all the pre-processing balance modules of the one of the plurality of balance modules stop balancing.

Preferably, the one of the plurality of balance modules detects voltages and/or currents and/or temperatures of a first battery and a second battery corresponding to the one of the plurality of balance modules.

Preferably, that the one of the plurality of balance modules detects voltages and/or currents and/or temperatures of a first battery and a second battery corresponding to the one of the plurality of balance modules means: the one of the plurality of balance modules determines whether the voltages and/or currents and/or temperatures of the first battery and the second battery are within in a range defined by upper and lower limit values, if the voltages and/or currents and/or temperatures of the first battery and the second battery are beyond the range, the one of the plurality of balance modules determines that a state of a battery is abnormal.

Preferably, when the one of the plurality of balance modules detects that the voltages and/or currents and/or temperatures of the first battery and the second battery recover to be within a normal range, it starts to balance and provides a normal signal representing a normal state which is transferred to the post-processing balance modules of the one of the plurality of balance modules stage by stage, so that all the post-processing balance modules of the one of the plurality of balance modules begin to balance, the last-processing balance module outputs the normal signal to the control module, the control module receives the normal signal and then provides the control signal representing a normal state to the first-processing balance module, the control signal is transferred stage by stage, so that all the pre-processing balance modules of the one of the plurality of balance modules starts to balance.

According to a third aspect, there is provided a battery system, comprising any of the battery balance circuit described above.

Compared with the prior art, the circuit structure and the method of the disclosure have following advantages. The battery balance circuit according to the disclosure is formed based on a circuit structure having a plurality of cascaded balance modules, in which, a judgement of abnormal states is realized together with the synchronizations of detection of battery states and battery balance. If there is battery abnormity, the battery detection and balance are stopped by signal transmission, at the same time, when the battery state recovers from an abnormal state to a normal state, the detection of battery states and battery balance also recover. According to the disclosure, the manner of pulling down current is taken as an example to transfer a control signal. The balance module has a logic input terminal Fi and an output logic terminal Fo, ground potential of the balance module at one stage is not greater than that of the balance module at next stage, so that, the logic output terminal of the pre-processing balance module can pull down the logic input terminal of the post-processing balance module to transfer the control signal from the pre-processing balance module to the post-processing balance module. The disclosure introduces a judgement of abnormal states of batteries additionally, and implements the detection and alarm for abnormal states, so that the system reliability is improved.

DETAILED DESCRIPTION OF THE DISCLOSURE

Reference will now be made in detail to particular embodiments of the disclosure, examples of which are illustrated in the accompanying drawings. It will be understood that the disclosure is not limited to these examples. On the contrary, the disclosure is intended to cover alternatives, modifications and equivalents that may be included within the spirit and scope of the disclosure as defined by the appended claims.

Furthermore, in the following detailed description of the present disclosure, numerous specific details are set forth in order to provide a thorough understanding of the present disclosure. However, it will be readily apparent to one skilled in the art that the present disclosure may be practiced without these specific details.

Reference will now be made in detail to particular embodiments of the disclosure, examples of which are illustrated in the accompanying drawings. The accompanying drawings are illustrative and not intended to be limiting, but are examples of embodiments of the invention, which are simplified for explanatory purposes and are not drawn to scale.

Figure 1:
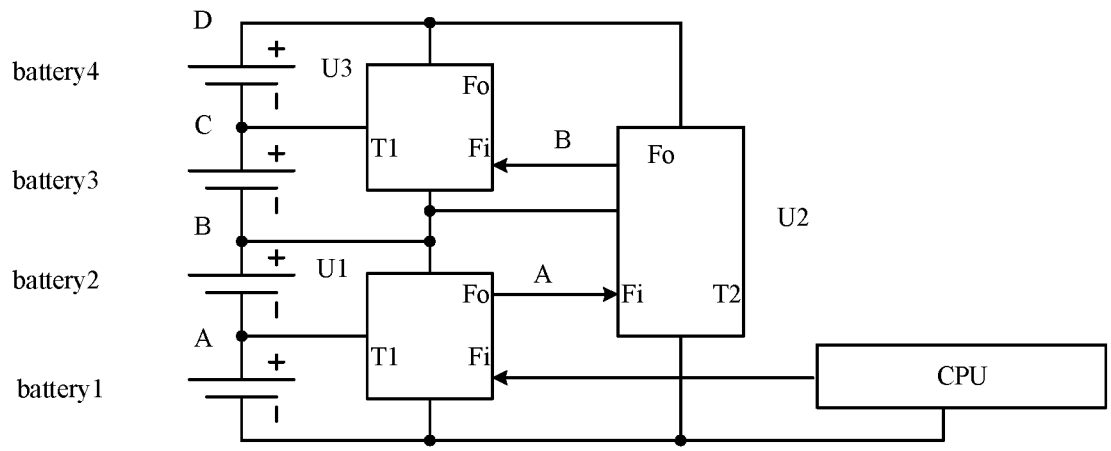
FIG. 1 is a schematic circuit diagram of a conventional battery balance circuit.
Figure 2:
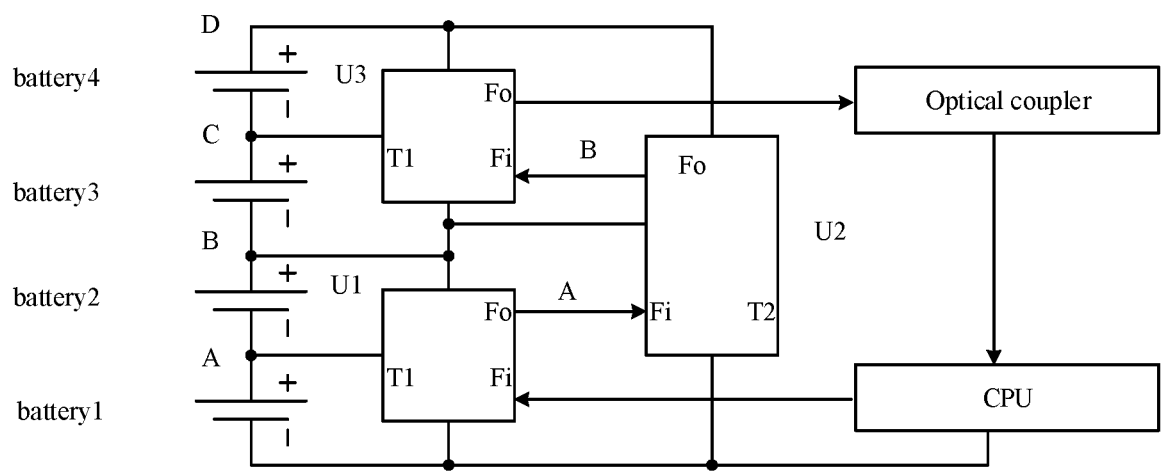
FIG. 2 is a schematic circuit diagram of a battery balance circuit according to an embodiment of the present disclosure.

Referring to FIG. 2, a battery balance circuit according to an embodiment of the present disclosure is illustrated by using four batteries as an example. Three balance modules constitute a cascaded circuit including series batteries 1 to 4, the balance modules U1, U2 and U3 performs balancing on the four series batteries 1 to 4. The balance module U1 has three input and output terminals respectively connected with the cathode of the battery 1, the anode of the battery 1 (i.e., the cathode of the battery 2) and the anode of the battery 2. The balance module U1 detects the voltages of the batteries 1 and 2, obtains a voltage difference between the two batteries and balances the voltages of the batteries 1 and 2 to control the voltage difference between the two batteries to be maintained within a certain value range. When the voltage of the battery 2 is greater than that of the battery 1 by a certain value, the balance module U1 transfers battery power from the battery 2 to the battery 1, by using point B as an input of the balance module U1 and point A as an output of the balance module U1, the balance module U1 is operated in a buck mode; when the voltage of the battery 1 is greater than that of the battery 2 by a certain value, the balance module U1 transfers battery power from the battery 1 to the battery 2, by using point A as the input of the balance module U1 and point B as the output of the balance module U1, the balance module U1 is operated in a boost mode. Similarly, the balance module U3 balances the voltages of the batteries 3 and 4, and the balance module U2 balances the voltage of the batteries 1 and 2 and the voltage of the batteries 3 and 4. The balance modules U1 and U3 performs a first level balance which is represented by T1, and the balance module U2 performs a second level balance which is represented by T2. The balance module U3, as a last-processing balance module of the embodiment, has a logic output terminal Fo being connected with an optocoupler, and transfers corresponding signals to CPU through the optocoupler. The CPU is connected with a logic input terminal of the balance module U1 and outputs a control signal. CPU is only an embodiment of a control module, and the CPU also has other functions, that means, the control module may be a single module which can implement the function of the disclosure, or be integrated into other modules to implement the function of the disclosure.

For the battery balance circuit having a plurality of series batteries, the control signal can be transferred by using pull-up or pull-down current. In the embodiment, the control signal can generally be referred to as a synchronization signal, that means, a plurality of the cascaded balance modules transfer the signals respectively representing synchronization of balance, detection of battery voltages and abnormity of battery states stage by stage.

The balance module has an synchronization input terminal Fi (i.e., the logic input terminal is referred to as the synchronization input terminal because the synchronization signals are transferred through it) and an synchronization output terminal Fo (i.e., the logic output terminal is referred to as the synchronization output terminal because the synchronization signals are transferred through it). When the ground potential of a pre-processing balance module is not greater than that of a post-processing balance module, the synchronization output terminal Fo of the pre-processing balance module can pull down the synchronization input terminal Fi of the post-processing balance module, so that, the synchronization signal can be transferred to the post-processing balance module from pre-processing balance module. The post-processing balance module then transfers the synchronization signal to a next post-processing balance module, the ground potential of which is not greater than that of the post-processing balance module. The last-processing balance module transfers the synchronization signal to the optocoupler and the optocoupler transfers the synchronization signal to the CPU.

When the battery is normal, the synchronization signal sent and received by the CPU are same. When a balance module detects a state of a battery to be abnormal, for example, the voltage of the battery is relative large or small, or other abnormal phenomenon that may exist, the balance module stops balancing and continuously pulls the synchronization signal up or down, so that, its post-processing balance modules also stop balancing and continuously pull the synchronization signal up or down as well. In this way, the synchronization signal received by the CPU has been continuously pulled up or down so that it becomes different from the synchronization signal sent by the CPU. Thus, the CPU determines that a state of a battery is abnormal, outputs the synchronization signal and continuously pulls it up and down as well. At last, all the balance modules stop balancing, and an alarm is output for reminding the maintenance personnel to check the abnormity of batteries. It should be noted that a signal in continuous high level or low level is only a way to characterize an abnormal state of a battery, other representation manner can also be used to represent the abnormal state of a battery, for example, a signal with a combination of high level and low level voltages in certain pattern can also characterize the abnormal state of the battery.

Figure 3:
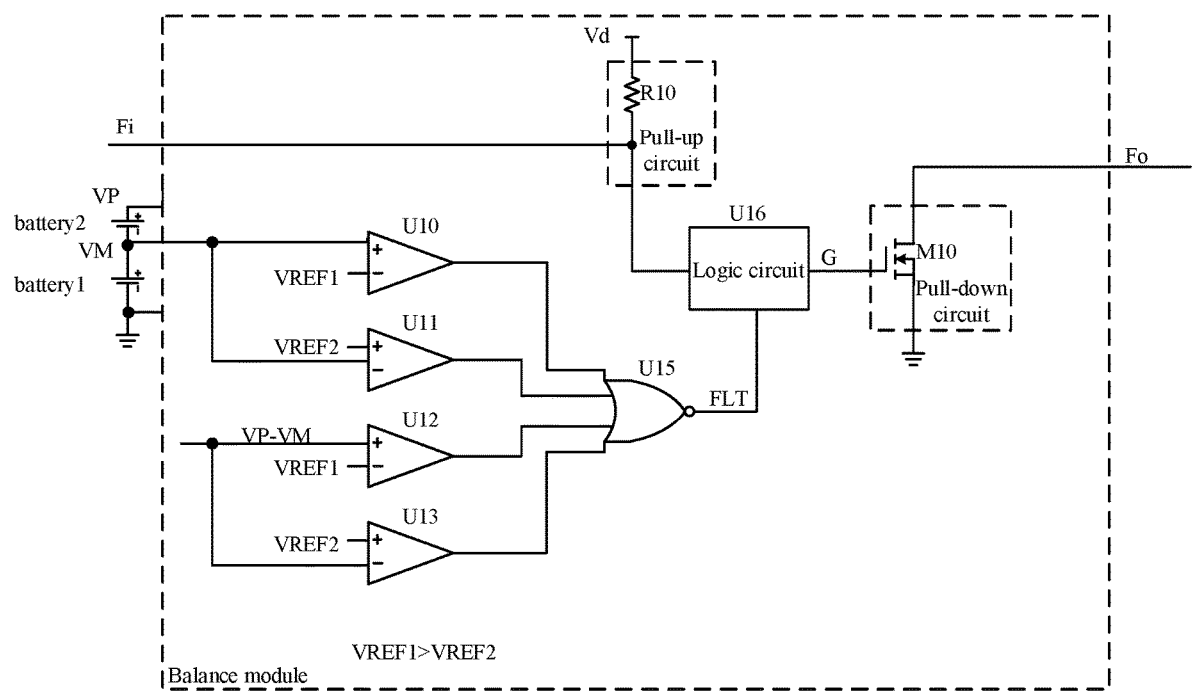
FIG. 3 is a schematic circuit diagram of a balance module according to an embodiment of the present disclosure.

FIG. 3 is a detailed circuit structure of a balance module according to an embodiment of the disclosure. The balance module includes a synchronization input terminal Fi and a synchronization output terminal Fo (i.e., the logic output terminal), a first control circuit is connected with the synchronization input terminal Fi through a pull-up circuit, a second control circuit is connected with the synchronization output terminal Fo through a pull-down circuit, the synchronization input terminal Fi of the balance module is connected with a control terminal of the pull-down circuit through a logic circuit.

The pull-up circuit includes a resistor R10, one terminal of the resistor R10 is connected with a power supply terminal Vd and the other terminal of the resistor R10 is connected with the synchronization input terminal Fi. The pull-down circuit includes a switch transistor M10, a first terminal of the switch transistor M10 is connected with the synchronization output terminal Fo, a second terminal of the switch transistor M10 is connected with the corresponding ground potential, and a control terminal G of the switch transistor M10 is connected with the logic circuit. The switch transistor M10 can use an N-type MOS (Metal Oxide Semiconductor) transistor. The switch transistor M10 can also be implemented by a P-type power transistor, and the circuits including the second control circuit and so on need to be modified, however, the ordinary skilled in the art can know this kind of changes.

According to the embodiment, the balance module can also include a battery detection module, the battery detection module respectively detects the voltages of a first battery 1 and a second battery 2 corresponding to the balance module, and determines that the voltages of the first battery 1 and the second battery 2 are within in a range defined by upper and lower limit values, if the voltage of the first battery 1 and/or the voltage of the second battery 2 are beyond the range defined by upper and lower limit values, the battery detection module determines that a state of a battery is abnormal and the determination is transferred to the logic circuit of the balance module.

Specifically, a first comparator U10 receives a signal VM representing the voltage of the first battery and a reference voltage VREF1 representing an upper limit value of the voltage of the first battery, a second comparator U11 receives a signal VM representing the voltage of the first battery and a reference voltage VREF2 representing a lower limit value of the voltage of the first battery, a third comparator U12 receives a signal VP-VM representing the voltage of the second battery and a reference voltage VREF3 representing an upper limit value of the voltage of the second battery, a fourth comparator U13 receives a signal VP-VM representing the voltage of the second battery and a reference voltage VREF4 representing a lower limit value of the voltage of the second battery, the output terminals of the first comparator U10, the second comparator U11, the third comparator U12 and the fourth comparator U13 are connected with input terminals of a NOR gate U15, and an output terminal of the NOR gate U15 is connected with the logic circuit U16. VREF1 and VREF2 are the upper and lower limit values of a normal voltage of the first battery, respectively, and the upper and lower limit values can be set according to actual conditions. When the voltage VM of the first battery 1 is greater than VREF1, the comparator U10 outputs a high-level value, when the voltage VM of the first battery 1 is less than VREF2, the comparator U11 outputs a high-level value, when the voltage VP-VM of the second battery 2 is greater than VREF1, the comparator U12 outputs a high-level value, when the voltage VP-VM of the second battery 2 is less than VREF2, the comparator U13 outputs a high-level value, as long as one of the comparators U10 to U14 outputs a high-level value, an output value FLT of the NOR gate U15 is zero, that means, the voltages of at least one of battery are abnormal. When FLT is zero, the logic circuit turns off the switch transistor M10, the synchronization output terminal Fo of the balance module is pulled up continuously by the post-processing balance modules. The first battery 1 and the second battery 2 only represent two batteries or battery packages corresponding to a certain balance module, first and second don't have specific meanings, the first battery and the second battery can be a specific single-cell battery or a battery package.

Figure 4:
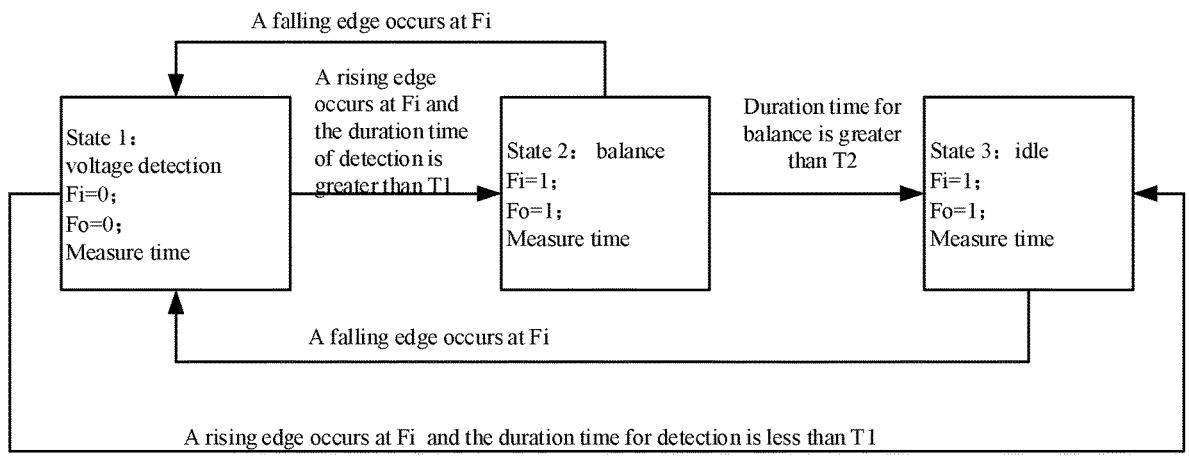
FIG. 4 is a illustrative flow diagram of an operating manner of a balance module according to an embodiment of the present disclosure.

FIG. 4 is an illustrative flow diagram of an operating manner of a balance module according to an embodiment of the present disclosure. When the synchronization input terminal Fi is in low level, an output point G of the logic circuit U16 is in high level, the switch transistor M10 is turned on, the synchronization output terminal Fo is in low level, at the time, the balance module don't perform balancing but performs the detection of battery voltages (as an example of the detection of battery states) and at the same time, the logic circuit measures time for the detection of battery voltages. When the synchronization input terminal Fi is no longer pulled down, a rising edge occurs, and the balance module stops the detection of battery voltages, the logic circuit output point G is in high level to turn off the switch transistor M10 when the synchronization input terminal Fi is in high level, and similarly, the synchronization input terminals of the post-processing balance modules are no longer pulled down and the rising edges occur stage by stage. A first time t1 is preset as a reference value of a voltage detection time, and if a low-level duration time (i.e., the voltage detection time) of the synchronization input Fi is greater than the first time t1, the balance module performs balancing when Fi is turned to be in high level; if the low-level duration time of the synchronization input terminal Fi is less than the first time t1, the detection of voltages is considered to be ineffective, and the balance module does not perform balancing when the synchronization input terminal Fi goes high level, at the time, the balance module enters into an idle state or mode to avoid false detection due to interference.

When the balance module perform balancing, the logic circuit U16 measures the duration time of balance. A second time t2 is preset, if the duration time of balance of the balance module is greater than the second time t2, Fi is set to be in low level and the balance module stops balancing to enter the idle mode, that is, the balance module doesn't balance and doesn't detect battery voltages, either; if the duration time of balance is less than the second time t2, the synchronization input terminal Fi is set to be in low level and a falling edge occurs, at the time, the balance module enters into a voltage detection state. In the idle mode, when the synchronization input terminal Fi is zero, if a falling edge is detected, the balance module also enters into the voltage detection state.

Figure 5:
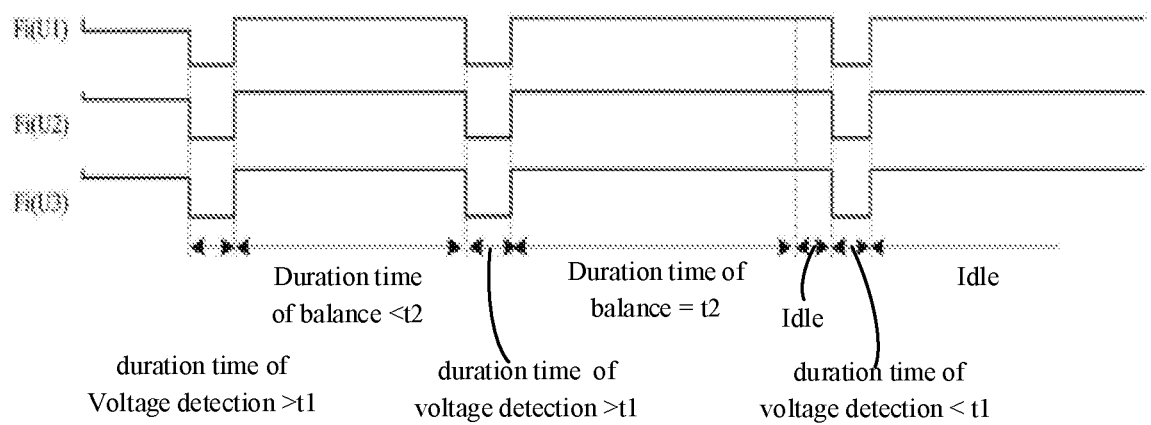
FIG. 5 is an operational waveform diagram of a balance module based on the flow diagram shown by FIG. 4.

FIG. 5 is an operational waveform diagram of a balance module based on the flow diagram in FIG. 4. When the CPU generates a synchronization signal and sends it to the synchronization input terminal Fi of the first-processing balance module U1, the first processing balance module U1 performs balancing after receiving the synchronization signal. Then the balance module U1 transfers the synchronization signal to the balance module U2 through the connection between the synchronization output terminal Fo of the balance module and the synchronization input terminal Fi of the balance module U2. Finally, the balance module U2 transfers the synchronization signal to the balance module U3. In this way, the synchronization signals are transferred to the post-processing balance modules stage by stage and the last-processing balance module transfers the synchronization signals to the CPU through the optocoupler. When the ground potential of a balance module is not less than that of its post-processing balance module, under normal conditions, the synchronization signals sent and received by the CPU are same.

When CPU pulls down the synchronization input terminal Fi of the balance module U1, the synchronization input terminal Fi of the balance module U1 is in low level, and the switch transistor M10 is controlled to be turned on, accordingly. The synchronization output terminal Fo pulls down the synchronization input terminal of the post-processing balance module, so that, the synchronization input terminal Fi of the post-processing balance module is detected by the switch transistor in the post-processing balance module to be in low level, and then the switch transistor in the post-processing balance module is turned on. In such way, the synchronization input terminals Fi in the balance modules are pulled down stage by stage, the switch transistor M10 is turned on accordingly, so that, all the balance modules stop balancing at the same time to perform voltage detection.

If the duration time of voltage detection is greater than the first time t1, the CPU stops pulling down the synchronization input terminal Fi, the synchronization input terminal Fi is pulled up to be in high level by the pull-up circuit and stops voltage detection to start balance, at the same time, the synchronization input terminal Fi controls the output point G of the logic circuit to be in low level to turn off M10, so that, the pull-down circuits stop pulling down the synchronization input terminals of the post-processing balance modules. In such way, the synchronization input terminals Fi of the balance modules are pulled up stage by stage to turn off M10, so that, all the balance modules stop voltage detection at the same time to start balance.

If the duration time of voltage detection is greater than the first time t1, the CPU stops pulling down the synchronization input terminal Fi, the synchronization input terminal Fi is pulled up to be in high level by the pull-up circuit and the balance module stops both of voltage detection and battery balance, at the same time, the synchronization input terminal Fi controls the output point G of the logic circuit to be in low level to turn off M10, so that, the pull-down circuit stops pulling down the synchronization input terminal of the post-processing balance module. In such way, the synchronization input terminals Fi of the balance modules are pulled up stage by stage to turn off M10, so that, all the balance modules stop voltage detection at the same time and don't balance either, that is, all the balance modules enter into the idle state or mode.

In the time period during the balance module performs balancing, if Fi is in high level and the CPU has not pulled down Fi after the duration time of balance reaches the second time t2, the balance module enters into the idle mode, that means, the balance module doesn't perform balancing or detect battery voltages. After the duration time of high level preset by the CPU, the CPU pulls down Fi to be in low level, and then M10 is turned on. In such way, the synchronization input terminals Fi of the balance modules are pulled down stage by stage, and the balance modules start voltage detection. Thus, the process is repeated. The first-processing balance module is configured to have the smallest ground potential among all the balance modules.

Figure 6:
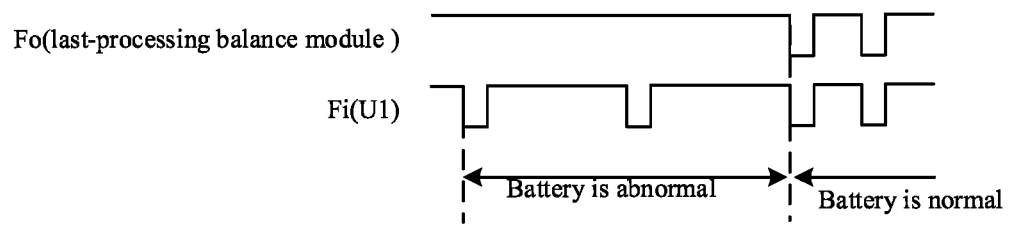
FIG. 6 is operational waveform diagrams of a first-processing balance module and a last-processing balance module in a first state.

FIG. 6 is operational waveform diagrams of a first-processing balance module and a last-processing balance module, which shows that a battery recovers from an abnormal state to a normal state. When the balance module finds abnormal phenomena such as a battery voltage beyond the range and so on, the balance module stops operating and controls the synchronization output terminal to be in high level continuously, and transfers a high-level signal at Fo to the synchronization input terminal Fi of the post-processing balance module so that the synchronization output terminal Fo of the post-processing balance module is in high level, in such way, high-level signals are transferred stage by stage until the synchronization output terminal Fo of the last-processing balance module is in high level, then the last-processing balance module transfers a high-level signal to the optocoupler and the optocoupler transfers a high-level signal to the CPU. When the CPU finds that the received signal from Fo is in high level continuously, it determines that there's an abnormity occurring. In a condition of battery abnormity, the CPU sends voltage detection pulses periodically for at most N times, and the frequency of sending the voltage detection pulses is less than a normal operating frequency. During this time period, if the voltage of the battery recovers to be normal, after the received synchronization signal of the CPU from Fo becomes normal, the system is recovered to operate normally, that is, the system performs voltage detection and balance in normal frequency.

Figure 7:
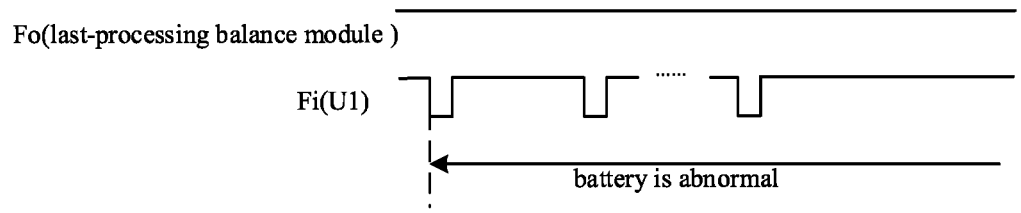
FIG. 7 is operational waveform diagrams of the first-processing balance module and the last-processing balance module in a second state.

FIG. 7 is operational waveform diagrams of a first-processing balance module and a last-processing balance module, which shows that a state of a battery cannot recovers from the abnormal state to the normal state. During the time period during which the CPU sends the voltage detection pulses periodically, the battery is abnormal at all the time and the CPU receives high-level signals continuously. After the CPU sends the voltage detection pulses for N times, the CPU stops sending the voltage detection pulses and begins to send a high-level signal. At the time, the system produces an alarm, the maintenance personnel needs to check the battery abnormity.

Because the timing of every balance module may be different, not all the balance modules stop balancing at the same time, that is, the stopping of pulling down the synchronization input terminals Fi will not happen at the same time, but in a time sequence, it may occur that some balance modules enter into the voltage detection mode and some balance modules are still in the balance mode. Obviously, the synchronization according to the disclosure is not an absolute synchronization, which exists a delay due to signal transfer, but it can already solve the technical problem of the disclosure. Thus, the scheme of the technical problem is not perfect.

The above embodiments are illustrated in detail by taking the abnormal state of batteries as an example. In actual conditions, the abnormal state also includes abnormal state of balance modules, and when a balance module is abnormal, the process and signal transmission can be performed according to that when the abnormal state of batteries occurs. Obviously, the embodiments are illustrated in detail by taking abnormal voltage of batteries as an example from the abnormal state of batteries. However, in actual conditions, the abnormal state of batteries includes abnormal states of battery current and battery temperature and so on, the several kinds of abnormal states may occur at the same time or only one kind of abnormal state occurs. In an embodiment of the abnormal state of battery current, a resistor is used to sample corresponding current to obtain a voltage signal representing current and a judgement is implemented by comparing the voltage signal with the normal range or a range defined by upper and lower limit values. In an embodiment of the abnormal state of battery temperature, a PN junction is used for detecting voltage drops at a certain current, for example, voltage drops of the PN junction of a diode or voltage drops of the PN junctions of a NPN transistor.

While the embodiments have been described and illustrated separately, it is apparent to those skilled in the art that the common parts can be replaced and integrated between embodiments, and the content that is not explicitly described in one embodiment can refer to another embodiment which explicitly describes the content.

The preferred embodiments of the present invention are described in the above paragraphs, but not construed as limiting the present invention. Many modifications, equivalence, variations of the preferred embodiments can be made without departing from the doctrine and spirit of the present invention.

The invention claimed is:

1. A battery balance circuit, comprising:
   a plurality of balance modules configured to balance a plurality of batteries being coupled in series; and
   a control module configured to provide a control signal to a logic input terminal of a first-processing balance module of said plurality of balance modules,
   wherein, among said plurality of balance modules, a logic output terminal of a pre-processing balance module is coupled to a logic input terminal of a post-processing balance module, a logic output terminal of a last-processing balance module is connected with said control module,
   when one of said plurality of balance modules detects an abnormal state on itself or on a corresponding battery of said plurality of batteries, it stops balancing and provides an abnormal signal representing the abnormal state and transfers said abnormal signal to the post-processing balance modules of said one of said plurality of balance modules through corresponding logic output terminals stage by stage, so that all of the post-processing balance modules of said one of said plurality of balance modules stop balancing, and then said abnormal signal is transferred from said logic output terminal of said last-processing balance module to said control module;
   when said control module receives said abnormal signal, it determines that a state of a battery is abnormal and outputs said control signal representing an ending of balancing which is transferred from said first-processing balance module stage by stage, so that all the pre-processing balance modules of said one of said plurality of balance modules stop balancing.

2. The battery balance circuit according to claim 1, wherein said one of said plurality of balance modules comprises: a first control circuit, a second control circuit and a logic circuit,
   said first control circuit is connected with said logic input terminal of said one of said plurality of balance modules, said second control circuit is connected with said logic output terminal of said one of said plurality of balance modules, and said logic circuit is connected between said first control circuit and said second control circuit.

3. The battery balance circuit according to claim 2, wherein said one of said plurality of balance modules further comprises:

a battery detection module configured to detect one or more parameters selected from voltages, currents and temperatures of a first battery and a second battery corresponding to said one of said plurality of balance modules.

4. The battery balance module according to claim 3, wherein said battery detection module determines whether said one or more parameters selected from the voltages, the currents and the temperatures of said first battery and said second battery are within a range defined by upper and lower limit values, if one or more parameters of said first battery and said second battery are beyond said range, said battery detection module determines that the states of corresponding batteries are abnormal and then transfers its determination to said logic circuit of said one of said plurality of balance modules.

5. The battery balance module according to claim 4, wherein, when said battery detection module detects that said one or more parameters selected from the voltages, the currents and the temperatures of said first battery and said second battery recovers to be within a normal range, said one of said plurality of balance modules starts to balance and provides a normal signal representing a normal state which is transferred to the post-processing balance modules of said one of said plurality of balance modules stage by stage, so that all the post-processing balance modules of said one of said plurality of balance modules begin to balance, said last-processing balance module outputs said normal signal to said control module, said control module receives said normal signal and then provides said control signal representing the normal state to said first-processing balance module which is transferred stage by stage, so that all the pre-processing balance modules of said one of said plurality of balance modules start to balance.

6. The battery balance circuit according to claim 1, further comprising: an optocoupler, which is connected between said logic output terminal of said last-processing balance module and said control module.

7. The battery balance circuit according to claim 3, wherein, said battery detection module comprises:
a first comparator which has an input terminal for receiving a signal representing a voltage of said first battery and a reference value representing an upper limit value of the voltage of said first battery, and an output terminal being connected with a first input terminal of a NOR gate;
a second comparator which has an input terminal for receiving a signal representing a voltage of said first battery and a reference value representing a lower limit value of the voltage of said first battery, and an output terminal being connected with a second input terminal of said NOR gate;
a third comparator which has an input terminal for receiving a signal representing a voltage of said second battery and a reference value representing an upper limit value of the voltage of said second battery, and an output terminal being connected with a third input terminal of said NOR gate;
a fourth comparator which has an input terminal for receiving a signal representing a voltage of said second battery and a reference value representing a lower limit value of the voltage of said second battery, and an output terminal being connected with a fourth input terminal of said NOR gate,
the output terminal of said NOR gate is connected with said logic circuit.

8. The battery balance circuit according to claim 2, wherein, said control module provides said control signal representing detecting battery states,
when said first-processing balance module receives said control signal representing detecting battery states, it performs detecting battery states and controls said second control circuit by said logic circuit, so that all the post-processing balance modules of said first-processing balance module perform detecting battery states stage by stage and at the same time, the logic circuit in each balance module measures time for detection of battery states,
when a state of a logic input terminal of a balance module has been changed but the duration time of detection of battery states does not reach a first time threshold, the detection of battery states is ineffective and the balance module does not perform balancing; when the state of the logic input terminal of the balance module has been changed and the duration time of detection of battery states reaches said first time threshold, the balance module performs balancing.

9. The battery balance circuit according to claim 2, wherein, while said plurality of balance modules perform balancing, the logic circuits measure time, when the duration time of battery balance reaches a second time threshold, said plurality of balance modules stop balancing.

10. The battery balance circuit according to claim 2, wherein said first control circuit is a pull-up circuit, said second control circuit is a pull-down circuit, the logic input terminal of each balance module is connected with a control terminal of the pull-down circuit through said logic circuit; or, said first control circuit is a pull-down circuit, said second control circuit is a pull-up circuit, the logic input terminal of each balance module is connected with a control terminal of the pull-up circuit through said logic circuit.

11. The battery balance circuit according to claim 2, wherein, when said one of said plurality of balance modules detects that a voltage of a battery is abnormal, said one of said plurality of balance modules stops balancing and detecting battery states, and maintains its logic output terminal to be in high level or low level,
said one of said plurality of balance modules provides a signal in high level or low level to the logic input terminals of the post-processing balance modules, so that the logic input terminals of the post-processing balance modules are set to be in high level or low level, and the signal in high level or low level is transferred stage by stage until the logic input terminal of said last-processing balance module is correspondingly set to be in high level or low level,
said last-processing balance module transfers the signal in high level or low level to the control module through its logic output terminal,
said control module determines a state of a battery is abnormal in accordance with the received signal in high level or low level.

12. A control method for battery balance, comprising:
receiving an abnormal signal from a plurality of balance modules which is configured to balance a plurality of batteries connected in series;
generating a control signal in according to the abnormal signal;
transferring said control signal to said plurality of balance modules; and
stopping balancing when said plurality of balance modules receives said control signal, wherein, among said plurality of balance modules, a logic output terminal of a pre-processing balance module is connected with a logic input terminal of a post-processing balance module, a logic output terminal of a last-processing balance module is connected with a control module, when one of said plurality of balance modules detects an abnormal state on itself or on a corresponding battery of said plurality of batteries, it stops balancing and provides an abnormal signal representing the abnormal state which is transferred to the post-processing balance modules of said one of said plurality of balance modules through corresponding logic output terminals stage by stage so that all of the post-processing balance modules of said one of said plurality of balance modules stop balancing, and then said abnormal signal is transferred from said logic output terminal of said last-processing balance module to said control module;

when said control module receives said abnormal signal, it determines that a state of a battery is abnormal and outputs said control signal representing an ending on balancing, said control signal is transferred from said first-processing balance module stage by stage, so that all the pre-processing balance modules of said one of said plurality of balance modules stop balancing.

13. The control method for battery balance according to claim 12, wherein, said one of said plurality of balance modules detects one or more parameters selected from voltages, currents and temperatures of a first battery and a second battery corresponding to said one of said plurality of balance modules.

14. The control method for battery balance according to claim 13, that said one of said plurality of balance modules detects said one or more parameters selected from the voltages, or the currents and the temperatures of a first battery and a second battery corresponding to said one of said plurality of balance modules means: said one of said plurality of balance modules determines whether said one or more parameters of said first battery and said second battery are within in a range defined by upper and lower limit values, if said one or more parameters of said first battery and said second battery are beyond said range, said one of said plurality of balance modules determines a state of a battery is abnormal.

15. The control method for battery balance according to claim 13, wherein, when said one of said plurality of balance modules detects that said one or more parameters of said first battery and said second battery recover to be within a normal range, it starts to balance and provides a normal signal representing a normal state which is transferred to the post-processing balance modules of said one of said plurality of balance modules stage by stage, so that all the post-processing balance modules of said one of said plurality of balance modules begin to balance, said last-processing balance module outputs the normal signal to said control module, said control module receives the normal signal and then provides said control signal representing a normal state to said first-processing balance module, said control signal is transferred stage by stage, so that all the pre-processing balance modules of said one of said plurality of balance modules start to balance.

16. The battery system, comprising:
a battery balance circuit according to claim 1; and
said plurality of batteries being coupled in series,
wherein said battery balance circuit is coupled to each one of said plurality of batteries.

* * * * *